US010355022B2

United States Patent
Min et al.

(10) Patent No.: US 10,355,022 B2
(45) Date of Patent: Jul. 16, 2019

(54) THIN FILM TRANSISTOR, METHOD FOR FABRICATING THE SAME, ARRAY SUBSTRATE, AND DISPLAY DEVICE

(71) Applicant: BOE TECHNOLOGY GROUP CO., LTD., Beijing (CN)

(72) Inventors: Jian Min, Beijing (CN); Xiaolong Li, Beijing (CN); Zhengyin Xu, Beijing (CN); Tao Gao, Beijing (CN); Dong Li, Beijing (CN); Shuai Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/393,030

(22) Filed: Dec. 28, 2016

(65) Prior Publication Data

US 2017/0200745 A1 Jul. 13, 2017

(30) Foreign Application Priority Data

Jan. 11, 2016 (CN) .......................... 2016 1 0016936

(51) Int. Cl.
*H01L 27/12* (2006.01)
*H01L 29/78* (2006.01)
(Continued)

(52) U.S. Cl.
CPC ........ *H01L 27/1222* (2013.01); *H01L 27/127* (2013.01); *H01L 27/1288* (2013.01); *H01L 29/78675* (2013.01)

(58) Field of Classification Search
CPC ............. H01L 27/1222; H01L 27/1228; H01L 29/78675; H01L 27/127; H01L 27/1288
(Continued)

(56) References Cited

U.S. PATENT DOCUMENTS 9,647,141 B2 * 5/2017 Song ................. H01L 29/78696
2002/0000557 A1 * 1/2002 Kido ................... H01L 21/0274
257/66
(Continued)

FOREIGN PATENT DOCUMENTS

CN 101241937 A 8/2008
CN 101807584 A * 2/2009 ............. H01L 29/78
(Continued)

OTHER PUBLICATIONS

Office Action in Chinese Application No. 201610016936.2 dated Mar. 7, 2017, with English translation. 10 pages.
(Continued)

*Primary Examiner* — Sheikh Maruf
(74) *Attorney, Agent, or Firm* — Womble Bond Dickinson (US) LLP

(57) ABSTRACT

A thin film transistor, a method for fabricating the same, an array substrate, and a display device are provided. The method comprises forming an active layer on a substrate, wherein source-and-drain-to-be-formed regions of the active layer are thicker than a semiconductor region between the source-and-drain-to-be-formed regions, and by a patterning process, forming a gate on the active layer, and forming a pattern of source and drain in the source-and-drain-to-be-formed regions of the active layer.

8 Claims, 5 Drawing Sheets

(51) Int. Cl.
*H01L 21/00* (2006.01)
*H01L 29/786* (2006.01)

(58) Field of Classification Search
USPC ..... 438/48, 128, 149, 151, 157, 283; 257/72
See application file for complete search history.

(56) References Cited

U.S. PATENT DOCUMENTS

| | | | |
|---|---|---|---|
| 2004/0104389 A1* | 6/2004 | Chen | H01L 29/4908 257/72 |
| 2006/0033109 A1* | 2/2006 | Park | G02F 1/136227 257/72 |
| 2007/0057326 A1* | 3/2007 | Morikado | H01L 27/108 257/347 |
| 2007/0222933 A1* | 9/2007 | Ohmi | G02F 1/1368 349/138 |
| 2007/0252207 A1* | 11/2007 | Park | H01L 27/12 257/347 |
| 2008/0142803 A1* | 6/2008 | Kaitoh | H01L 27/1222 257/59 |
| 2008/0191207 A1* | 8/2008 | Nishiura | H01L 29/66621 257/59 |
| 2009/0148970 A1* | 6/2009 | Hosoya | H01L 27/1214 438/29 |
| 2010/0123138 A1* | 5/2010 | Choi | H01L 29/66765 257/72 |
| 2014/0145179 A1* | 5/2014 | Yoon | H01L 29/66969 257/43 |
| 2014/0159037 A1* | 6/2014 | Kwon | H01L 29/78618 257/43 |
| 2014/0353669 A1* | 12/2014 | Seo | H01L 27/124 257/72 |
| 2016/0247839 A1* | 8/2016 | Dai | H01L 21/34 |
| 2016/0329360 A1* | 11/2016 | Li | H01L 29/78675 |
| 2016/0351725 A1 | 12/2016 | Song et al. | |
| 2018/0122955 A1* | 5/2018 | Aichi | H01L 21/26513 |

FOREIGN PATENT DOCUMENTS

| | | |
|---|---|---|
| CN | 101414564 A | 4/2009 |
| CN | 101807584 A | 8/2010 |
| CN | 101825815 A | 9/2010 |
| CN | 102683338 A | 9/2012 |
| CN | 104576753 A | 4/2015 |
| CN | 104779171 A | 7/2015 |
| CN | 104979380 A | 10/2015 |

OTHER PUBLICATIONS

Office Action in Chinese Application No. 201610016936.2 dated Aug. 9, 2016, with English translation. 11 pages.
Office Action in Chinese Application No. 201610016936.2 dated Dec. 9, 2016, with English translation. 14 pages.
Search Report in Chinese Application No. 201610016936.2 dated May 17, 2016, with English translation.
Office Action in Chinese Application No. 201610016936.2 dated Jun. 30, 2017, with English translation.

* cited by examiner

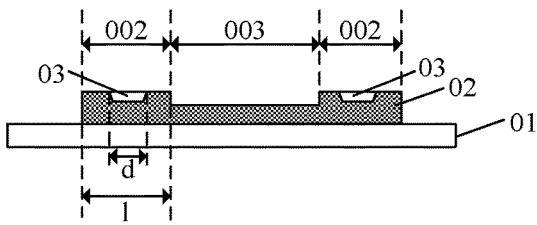
Fig. 1
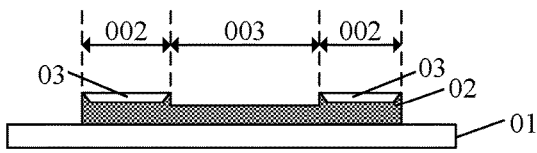
Fig. 2a
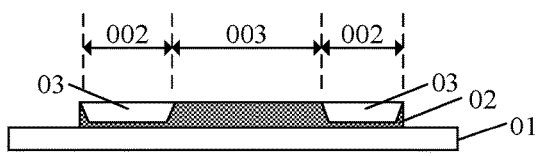
Fig. 2b
Fig. 3
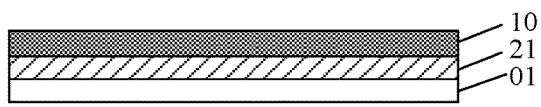
Fig. 4a

THIN FILM TRANSISTOR, METHOD FOR FABRICATING THE SAME, ARRAY SUBSTRATE, AND DISPLAY DEVICE

RELATED APPLICATIONS

The present application claims the benefit of Chinese Patent Application No. 201610016936.2, filed Jan. 11, 2015, the entire disclosure of which is incorporated herein by reference.

TECHNICAL FIELD

The present invention relates to the field of display technique, and in particular to a thin film transistor, a method for fabricating the same, an array substrate, and a display device.

BACKGROUND

As compared with an amorphous silicon thin film transistor (a-Si TFT), a low temperature poly-silicon thin film transistor (LTPS TFT) has several advantages, such as a very high mobility up to about 10-100 $cm^2/Vs$, capability of fabricating at relatively low temperature (e.g., lower than 600° C.), flexible choice in the substrate, low production cost. These features of LTPS TFTs are remarkable advantages for fabricating a flexible display, and have made LTPS TFTs to become the most important device for the industrial production of a flexible display.

Currently, one of the issues for LTPS TFTs is the ohmic contact between the source and drain and the active layer of poly silicon is not satisfactory. In particular, in a top gate TFT, after the active layer, a gate insulating layer, and a gate are formed on the substrate, through holes are formed in the source-and-drain-to-be-formed regions of the active layer and the gate insulating layer, so as to form a pattern of gate and source. However, the poly silicon layer is prone to be pierced during forming the through holes, which leads to an ohmic contact with a small area and large contact resistance. This phenomenon is more detrimental during fabricating the flexible device. In addition, the annealing temperature is relatively low for the flexible device. The ohmic contact is originally not satisfactory. In case the poly silicon is pierced, the contact resistance will further increase, and the device will suffer from serious degradation in characteristics.

Therefore, there is a desire to improve contact between the source and drain and the active layer in the art.

SUMMARY

The present invention provides a thin film transistor, a method for fabricating the same, an array substrate, and a display device, to alleviate or overcome one or more of the problems as described above.

Embodiments of the present invention provide a method for fabricating a thin film transistor, comprising:

step S101, forming an active layer on a substrate, wherein source-and-drain-to-be-formed regions of the active layer are thicker than a semiconductor region between the source-and-drain-to-be-formed regions; and step S102, by a patterning process, forming a gate on the active layer, and forming a pattern of source and drain in the source-and-drain-to-be-formed regions of the active layer.

In an exemplary implementation, step S102 comprises:

step S1021, by a patterning process, forming the gate on the active layer, forming grooves at portions of the source-and-drain-to-be-formed regions of the active layer with which a source and a drain are electrically connected, and forming the pattern of source and drain in the grooves.

In an exemplary implementation, the grooves have a sectional width smaller than the source-and-drain-to-be-formed regions.

In an exemplary implementation, step S101 comprises:

step S1011, forming a poly silicon layer on the substrate; and step S1012, by a patterning process, forming a pattern of active layer from the poly silicon layer, wherein source-and-drain-to-be-formed regions of the pattern of active layer are thicker than the semiconductor region between the source-and-drain-to-be-formed regions.

In an exemplary implementation, step S1012 comprises:

step S1012A, applying photoresist on the poly silicon layer, and exposing and developing the photoresist with a mask to form a photoresist-completely-reserved region, a photoresist-partially-reserved region, and a photoresist-completely-removed region, wherein the photoresist-completely-reserved region corresponds to the source-and-drain-to-be-formed regions, the photoresist-partially-reserved region corresponds to the semiconductor region between the source-and-drain-to-be-formed regions;

step S1012B, etching the poly silicon layer to which the photoresist-completely-removed region corresponds for the first time, to completely strip the poly silicon layer to which the photoresist-completely-removed region corresponds;

step S1012C, by an ashing process, stripping the photoresist in the photoresist-partially-reserved region, and thinning the photoresist in the photoresist-completely-reserved region; and step S1012D, etching the poly silicon layer to which the photoresist-partially-reserved region corresponds for the second time, to form the pattern of active layer.

In an exemplary implementation, after step S1012D, the method further comprises:

step S1012E, stripping the photoresist to which the photoresist-completely-reserved region corresponds.

In an exemplary implementation, step S1012D comprises:

dry etching the poly silicon layer to which the photoresist-partially-reserved region corresponds, so that the poly silicon layer to which the photoresist-partially-reserved region corresponds is thinner than the poly silicon layer to which the photoresist-completely-reserved region corresponds, and the poly silicon layer to which the photoresist-partially-reserved region corresponds has a thickness larger than zero.

In an exemplary implementation, the mask is a half tone mask, a gray tone mask, or a mask with slits.

In an exemplary implementation, step S1021 comprises:

step S1021A, by a patterning process, forming in sequence a gate insulating layer, the gate, and an interlayer insulating layer on the active layer;

step S1021B, forming a first through hole and a second through hole in regions of the source-and-drain-to-be-formed regions of the active layer to which the interlayer insulating layer and the gate insulating layer correspond, wherein the first through hole enables the source to be formed to be electrically connected with the active layer, and the second through hole enables the drain to be formed to be electrically connected with the active layer; and step S1021C, forming a pattern of source in the first through hole, and forming a pattern of drain in the second through hole at the same time.

In an exemplary implementation, step S1021C comprises:

forming a patterned photoresist layer on the interlayer insulating layer, wherein the patterned photoresist layer does not cover regions where the first through hole and the second through hole are located; and by a patterning process, forming the pattern of source in the first through hole, and forming the pattern of drain in the second through hole at the same time.

In an exemplary implementation, step S1021C further comprises:

after forming the patterned photoresist layer, and prior to forming the pattern of source and the pattern of drain, doping the active layer through the first through hole and the second through hole by ion implantation.

Accordingly, embodiments of the present invention provide a thin film transistor, comprising an active layer on a substrate, a source and a drain which are arranged on the active layer and are electrically connected with the active layer, and a gate on the active layer, wherein regions of the active layer to which the source and the drain correspond are thicker than a semiconductor region between the regions of the active layer to which the source and the drain correspond.

In an exemplary implementation, in the regions of the active layer to which the source and the drain correspond, grooves are formed at portions of the regions with which the source and the drain are electrically connected.

In an exemplary implementation, the grooves have a sectional width smaller than the source-and-drain-to-be-formed regions.

Accordingly, embodiments of the present invention further provide an array substrate, comprising the thin film transistor in the above embodiments of the present invention.

Accordingly, embodiments of the present invention further provide a display device, comprising the array substrate in the above embodiments of the present invention.

The array substrate and the display device in embodiments of the present invention relate to all embodiments of the thin film transistor and the method for fabricating the same as described, and have the same or similar technical effects.

BRIEF DESCRIPTION OF THE DRAWINGS

FIG. 1 is a flow chart illustrating a method for fabricating a thin film transistor according to an embodiment of the present invention;

FIG. 2*a* is a view illustrating a structure obtained by a method for fabricating a thin film transistor according to an embodiment of the present invention;

FIG. 2*b* is a view illustrating another structure obtained by a method for fabricating a thin film transistor according to an embodiment of the present invention;

FIG. 3 is a view illustrating another structure obtained by a method for fabricating a thin film transistor according to an embodiment of the present invention;

FIGS. 4*a*, 4*b*, 4*c*, 4*d*, 4*e*, 4*f*, 4*g*, 4*h*, and 4*i* are views illustrating structures after each step of a method for fabricating a thin film transistor according to an embodiment of the present invention;

DETAILED DESCRIPTION OF EMBODIMENTS

Figure 4B:
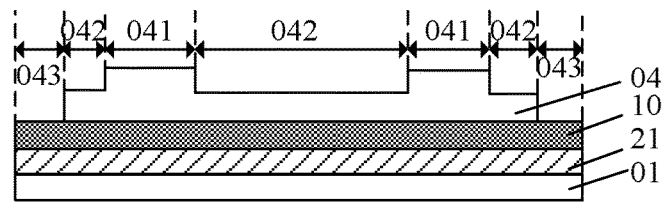

Embodiments of the present invention provide a thin film transistor, a method for fabricating the same, an array substrate, and a display device, for alleviating or overcoming poor contact between the source and drain and the active layer, thus improving stability of the thin film transistor.

The specific embodiments of the thin film transistor, the method for fabricating the same, the array substrate, and the display device shall be further described in the following text with reference to the figures and the embodiments. The following embodiments are only used for explaining more clearly the technical solution of the present invention rather than limiting the protection scope of the present invention.

As shown in FIG. 1, an embodiment of the present invention provides a method for fabricating a thin film transistor, which comprises:

step S101, forming an active layer on a substrate, wherein source-and-drain-to-be-formed regions of the active layer are thicker than a semiconductor region between the source-and-drain-to-be-formed regions; and step S102, by a patterning process, forming a gate on the active layer, and forming a pattern of source and drain in the source-and-drain-to-be-formed regions of the active layer.

In the method of an embodiment of the present invention, the active layer is formed on the substrate, and source-and-drain-to-be-formed regions of the active layer are thicker than the semiconductor region between the source-and-drain-to-be-formed regions. Namely, during forming the active layer, the source-and-drain-to-be-formed regions of the active layer are thicker than the semiconductor region between the source-and-drain-to-be-formed regions. This prevents poly silicon in the active layer from being etched through (i.e., the poly silicon is at least locally etched to a thickness of zero), and improves contact between the source and drain and the active layer, thus improving stability of the thin film transistor, thus improving stability of the thin film transistor It is noted that, in the method of an embodiment of the present invention, the patterning process comprises any kind of patterning approach, e.g., an approach which utilizes photoresist exposing, developing, and etching. This approach comprises steps, but not limited to, of applying photoresist, exposing with a mask, developing, and etching a layer into a patterned layer. The patterning process is mentioned several times in this description, but it does not necessarily comprise identical process steps.

During implementation, in an exemplary embodiment, step S102 comprises: step S1021, by a patterning process, forming the gate on the active layer, forming grooves at portions of the source-and-drain-to-be-formed regions of the active layer with which a source and a drain are electrically connected, and forming the pattern of source and drain in the grooves. This facilitates increasing a contact area between the source and drain and the active layer of the thin film transistor, increasing an ohmic contact region which will be formed when the source and the drain contact the active layer, and decreasing a contact resistance of the ohmic contact region.

In an embodiment of the present invention, grooves are formed at portions of the source-and-drain-to-be-formed regions of the active layer with which the source and the drain are electrically connected. When the grooves are ready for forming the pattern of source and drain, the grooves have a sectional width smaller than the source-and-drain-to-be-formed regions. As shown in FIG. 2a, the active layer 02 formed on the substrate 01 comprises the source-and-drain-to-be-formed regions 002, and the semiconductor region 003 between the source region and the drain region. The active layer comprises grooves 03, and the grooves 03 are arranged at portions of the active layer with which the pattern of source and the pattern of drain are electrically connected. Since the pattern of source and the pattern of drain are formed in grooves, the source and the drain are enabled to contact the active layer, and to form an ohmic contact region. The grooves 03 have a sectional width d smaller than a sectional width 1 of the source-and-drain-to-be-formed regions.

It is noted that, description is made by taking the grooves having a sectional width smaller than the source-and-drain-to-be-formed regions as an exemplary embodiment. During practical application or fabricating process, the grooves may have a sectional width equal to that of the source-and-drain-to-be-formed regions. For example, as shown in FIG. 2b, the grooves 03 have a sectional width d smaller than a sectional width 1 of the source-and-drain-to-be-formed regions.

FIG. 3 shows a further exemplary embodiment. As shown, at the same time as forming the grooves, a portion of the source-and-drain-to-be-formed regions 002 by which the source-and-drain-to-be-formed regions are thicker than the semiconductor region 003 is etched away, and the formed grooves 03 are shown in FIG. 3.

An exemplary implementation of step S101 is described hereinafter with reference to FIGS. 4a-4f.

In step S1011, a poly silicon layer is formed on the substrate 01.

In step S1012, by a process in which patterning is performed once and etching is performed twice, the poly silicon layer is formed into a pattern of the active layer 02 shown in FIG. 2a, FIG. 2b or FIG. 3. In the pattern of active layer, the source-and-drain-to-be-formed regions 002 are thicker than the semiconductor region 003 between the source-and-drain-to-be-formed regions.

In particular, in the present embodiment, patterning is performed once and etching is performed twice. As compared with a case in which patterning is performed once and etching is performed once, only one etching process is added. This prevents poly silicon in the active layer from being etched through, and improves contact between the source and drain and the active layer, thus improving stability of the thin film transistor.

In a specific embodiment, as shown in FIG. 4a, prior to forming the poly silicon layer 10 on the substrate 01, the method further comprises forming a buffer layer 21 on the substrate 01. The buffer layer is made from silicon oxide, silicon nitride, or a combination thereof. As an example, the buffer layer has a thickness about 100-400 nm. The buffer layer which is formed on the substrate from silicon oxide or silicon nitride acts as a barrier layer and a planarization layer. Besides, the buffer layer facilitates relaxation of stress in layers. In particular, forming the poly silicon layer 10 on the buffer layer 21 comprises depositing a amorphous silicon layer on the buffer layer 21 by a method like PECVD. For example, the amorphous silicon has a thickness about 70-100 nm, and the depositing temperature is not higher than 400° C. Then, a dehydrogenation annealing is performed at about 400° C. for a period of no less than 100 minutes. After the dehydrogenation annealing, the amorphous silicon is crystallized by an excimer laser annealing (ELA) process. For example, in the excimer laser annealing process, a XeCl laser operating at a wavelength of 308 nm is used, and the laser beams have an overlapping ratio about 90%-98%. During the excimer laser annealing process, the amorphous silicon is reconstructed in structure under the laser energy, i.e., is completely melt and recrystallized quickly to form poly silicon.

It is noted that, during fabricating a flexible product, it is necessary to form a flexible substrate on the substrate with a flexible process, prior to forming the buffer layer. This process is not repeated here for simplicity.

As shown in FIG. 4b, in step S1012A, photoresist 04 is applied on the poly silicon layer 10, and exposing and developing are performed on the photoresist 04 with a mask, to form photoresist-completely-reserved region 041, a photoresist-partially-reserved region 042, and a photoresist-completely-removed region 043. The photoresist-completely-reserved region 041 corresponds to the source-and-drain-to-be-formed regions, and the photoresist-partially-reserved region 042 between the photoresist-completely-reserved region 041 corresponds to the semiconductor region between the source-and-drain-to-be-formed regions.

Figure 4C:
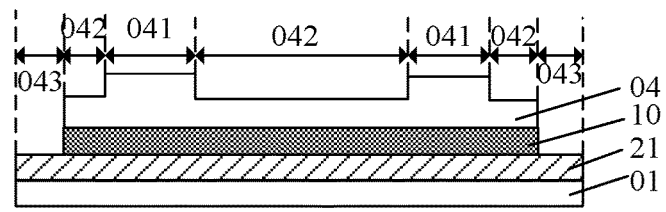

As shown in FIG. 4c, in step S1012B, the photoresist 04 in the photoresist-completely-reserved region 041 and the photoresist-partially-reserved region 042 is applied as a mask, and a first etching process is performed to completely strip the poly silicon layer 10 to which the photoresist-completely-removed region 043.

Figure 4D:
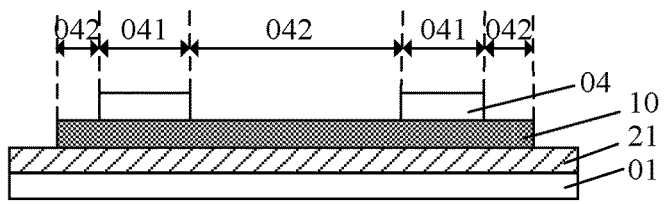

As shown in FIG. 4d, in step S1012C, the photoresist 04 is stripped in the photoresist-partially-reserved region 042, and is thinned in the photoresist-completely-reserved region 041, by an ashing process.

Figure 4E:
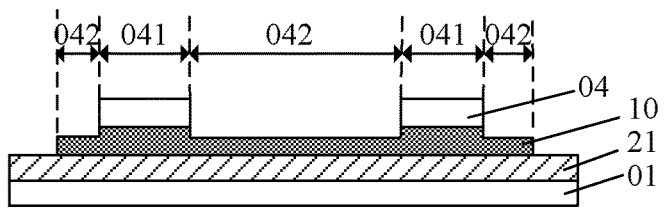

As shown in FIG. 4e, in step S1012D, the thinned photoresist 04 in the photoresist-completely-reserved region 041 is applied as a mask, and a second etching process is performed. The poly silicon layer 10 to which the photoresist-partially-reserved region 042 corresponds is etched to form the pattern of active layer.

Figure 4F:
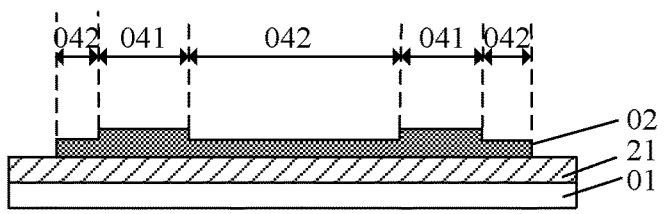

As shown in FIG. 4f, in step S1012E, the photoresist 04 in the photoresist-completely-reserved region 041 is stripped.

In a specific embodiment, for example, the photoresist 04 applied on the poly silicon layer 10 has a thickness about 1.5-3 nm. The photoresist-completely-reserved region 041 as formed above has a thickness about 5-10 nm, or larger than 10 nm. For example, in the first etching process described with respect to FIG. 4c, dry etching is applied to increase etching accuracy. For example, after the ashing process, the thinned photoresist 04 in the photoresist-completely-reserved region 041 shown in FIG. 4e has a thickness about 1-2 nm, so as to facilitate stripping the photoresist in a subsequent step.

During implementation, in an embodiment of the method, a second etching process is performed to form the pattern of active layer. The following measures are used to prevent the second etching process from over-etching the semiconductor region between the source and the drain. For example, in a case of over-etching, the semiconductor region is partially or completely etched away. For example, the second etching process in step S1012D comprises: dry etching the poly silicon layer 02 to which the photoresist-partially-reserved region 042 corresponds, so that the poly silicon layer 02 to which the photoresist-partially-reserved region 042 corresponds is thinner than the poly silicon layer 02 to which the photoresist-completely-reserved region 041 corresponds, and the poly silicon layer 02 to which the photoresistpartially-reserved region 042 corresponds is thicker than zero. The poly silicon layer 02 to which the photoresist-partially-reserved region 042 corresponds is the semiconductor region between the source and the drain, and the poly silicon layer 02 to which the photoresist-completely-reserved region 041 corresponds is the source region and the drain region.

In a specific embodiment, for example, during the second etching process, the poly silicon layer 02 is etched by a dry etching process. The dry etching process facilitates decreasing the surface roughness of the poly silicon layer. To further improve the surface roughness, the poly silicon layer is subject to a process with a solution after dry etching. For example, once the poly silicon layer is subject to the second etching process, the poly silicon layer 02 to which the photoresist-partially-reserved region 042 corresponds is thinned from about 70-100 nm to about 30-50 nm. Besides, the poly silicon layer 02 to which the photoresist-completely-reserved region 041 corresponds is not decreased in thickness, which is still about 70-100 nm, since it is protected by the photoresist layer 04. This ensures that the source-and-drain-to-be-formed regions in the poly silicon layer are thicker than the semiconductor region between the source-and-drain-to-be-formed regions.

During implementation, in the method of an embodiment of the present invention, the mask is a half tone mask, a gray tone mask, or a mask with slits.

An exemplary implementation of step S1021 is described hereinafter with reference to FIGS. 4g-4i.

Figure 4G:
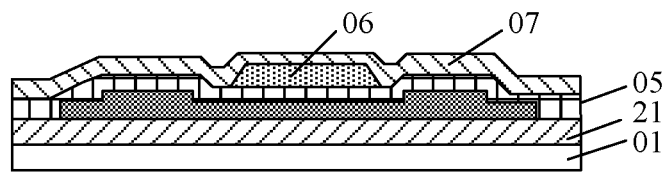

As shown in FIG. 4g, in step S1021A, the gate insulating layer 05, the gate 06, and an interlayer insulating layer 07 are formed in sequence on the structure shown in FIG. 4f by a patterning process.

Figure 4H:
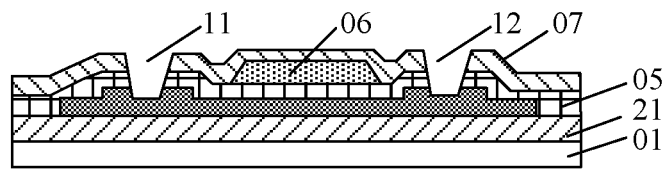

As shown in FIG. 4h, in step S1021B, a first through hole 11 and a second through hole 12 are formed in the source-and-drain-to-be-formed regions 002. The first through hole 11 and the second through hole 12 penetrate the interlayer insulating layer 07 and the gate insulating layer 05, and extend into the active layer 02 (i.e., poly silicon layer). Namely, the active layer 02 in the source-and-drain-to-be-formed regions 002 is provided with grooves. The source to be formed penetrates the first through hole 11 and is electrically connected the active layer 02, and the drain to be formed penetrates the second through hole 12 and is electrically connected the active layer 02.

Figure 4I:
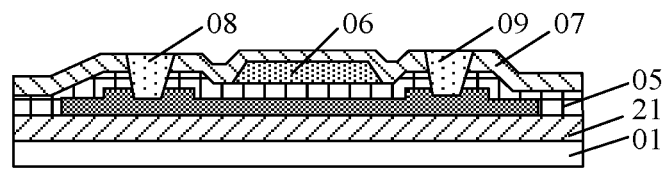

As shown in FIG. 4i, in step S1021C, a pattern of the source 08 is formed in the first through hole 11, and a pattern of the drain 09 is formed in the second through hole 12 at the same time.

In particular, in an embodiment of the present invention, through holes are arranged in the source-and-drain-to-be-formed regions. The through holes penetrate the interlayer insulating layer and the gate insulating layer, and extend into the active layer. The pattern of source and drain is formed in the through holes. Since the active layer is relatively thick in the source-and-drain-to-be-formed regions, when the gate insulating layer is etched to reveal the active layer in the etching process for the through holes, the active layer will not be etched through due to over-etching. Besides, residuals of the gate insulating layer in the through holes due to under-etching are avoided. In this manner, the contact between the source and drain and the active layer is improved, which improves stability of the thin film transistor.

In an exemplary embodiment, a portion of the active layer is etched during forming through holes, so that the active layer has grooves in the source-and-drain-to-be-formed regions. When the source and the drain are formed in the grooves, the contact area between the source and drain and the active layer is further increased, so that the contact resistance decreases, and device reliability of the thin film transistor increases.

In a specific embodiment, the gate insulating layer is deposited on the active layer by a method like PECVD. The gate insulating layer for example comprises silicon oxide or silicon nitride, and the material of the gate insulating layer is not limited to these materials. For example, the gate insulating layer has a thickness about 50-200 nm. A gate layer is deposited on the formed gate insulating layer by a method like magnetron sputtering, and the gate layer has a thickness about 80-300 nm. The gate comprises a metallic material, e.g., one or more of aluminum, molybdenum, copper, and tungsten. Then, a pattern of gate is formed by a process comprising exposing, developing, and etching. Furthermore, the interlayer insulating layer deposited on the gate for example prevents a short between the gate and the source and drain. The interlayer insulating layer comprises one or more of silicon oxide and silicon nitride. The interlayer insulating layer has a thickness about 200-600 nm. Then, in the source-and-drain-to-be-formed regions, the interlayer insulating layer, the gate insulating layer, and a portion of the active layer are etched by a dry etching process, to form the first through hole and the second through hole.

During implementation, in the method of an embodiment of the present invention, step S1021C comprises: forming a patterned photoresist layer on the interlayer insulating layer 07, wherein the patterned photoresist layer does not cover regions where the first through hole 11 and the second through hole 12 are located; and forming the pattern of source 08 in the first through hole 11 and the pattern of drain 09 in the second through hole 12 by a patterning process. In an exemplary embodiment, after forming the patterned photoresist layer, and prior to forming the pattern of source and drain, doping is performed in the source-and-drain-to-be-formed regions by a method like ion implantation.

Figure 5:
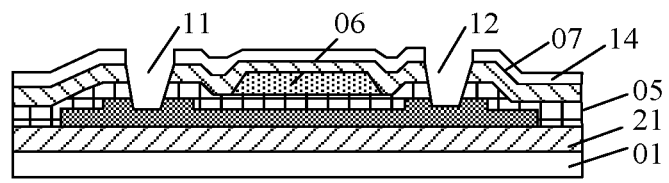
FIG. 5 is a view illustrating a further structure obtained by a method for fabricating a thin film transistor according to an embodiment of the present invention.

In a specific embodiment, as shown in FIG. 5, a photoresist 14 is formed on the interlayer insulating layer 07, and has a thickness about 2-3 nm. The photoresist 14 in the first through hole 11 and the second through hole 12 is stripped by exposing and developing. Additionally or alternatively, after exposing and developing, an ashing process is performed to remove potential residuals of the photoresist 14 in the first through hole 11 and the second through hole 12. Then, the active layer in the first through hole and the second through hole is doped by a method like ion implantation, for decreasing resistance of an ohmic contact between the source and drain to be formed and the active layer, thus providing an excellent ohmic contact. A metallic layer is deposited in the first through hole and second through hole by a method like magnetron sputtering, so as to form the source and drain. The metallic layer has a thickness about 100-300 nm. The metallic layer for example comprises one or more metallic material selected from aluminum, molybdenum, copper and tungsten. Finally, the pattern of source and the pattern of drain are formed by a process comprising exposing, developing and etching.

Figure 6:
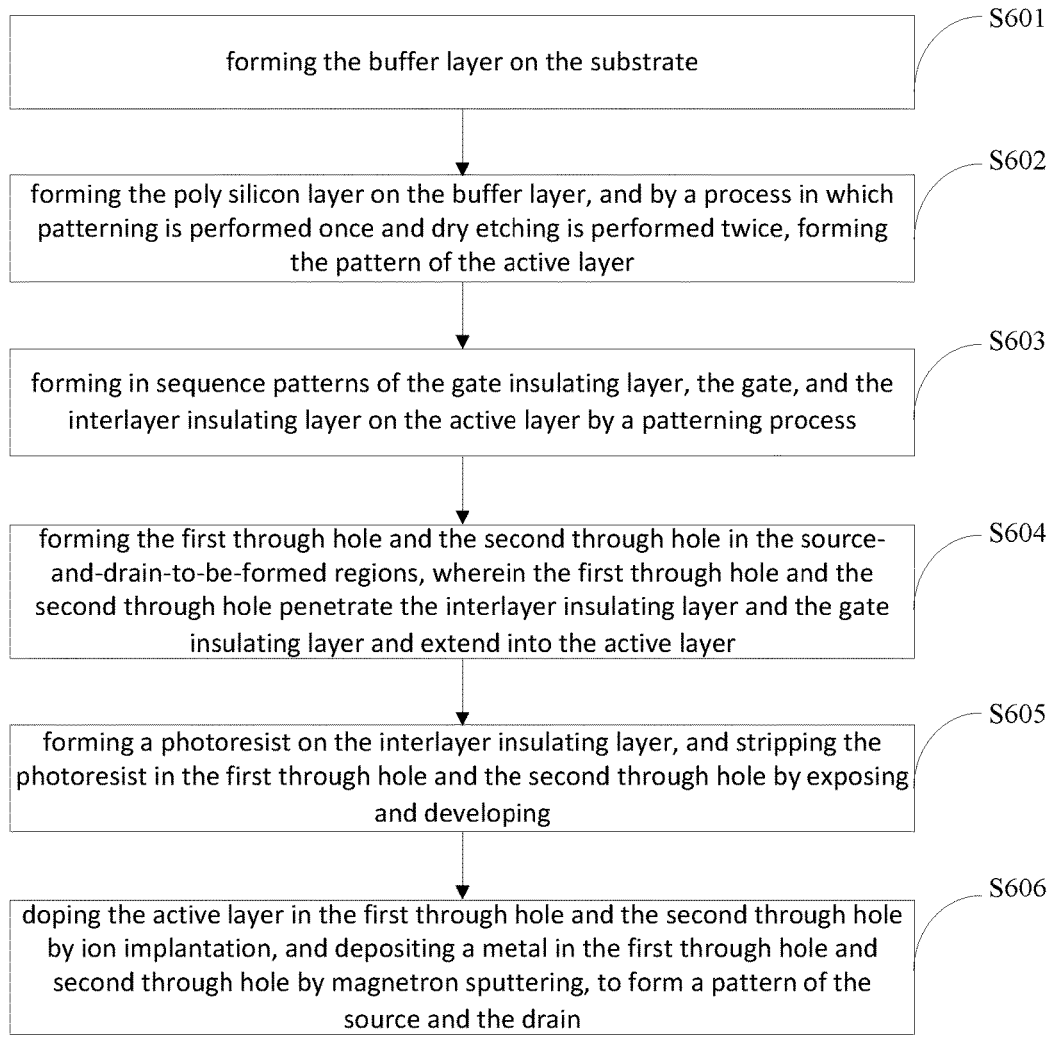
FIG. 6 is a flow chart illustrating a method for fabricating a thin film transistor according to an embodiment of the present invention.

An embodiment of the above method is described hereinafter with reference to the structure shown in FIG. 4i. As shown in FIG. 6, the method comprises the following steps:

S601, forming the buffer layer 21 on the substrate;

S602, forming the poly silicon layer 10 on the buffer layer 21, and by a process in which patterning is performed once and dry etching is performed twice, forming the pattern of the active layer 02, as shown in FIG. 4f;

S603, forming in sequence patterns of the gate insulating layer 05, the gate 06, and the interlayer insulating layer 07 on the active layer 02 by a patterning process, as shown in FIG. 4g;

S604, forming the first through hole 11 and the second through hole 12 in the source-and-drain-to-be-formed regions, wherein the first through hole 11 and the second through hole 12 penetrate the interlayer insulating layer 07 and the gate insulating layer 05 and extend into the active layer 02, as shown in FIG. 4h;

S605, forming the photoresist 14 on the interlayer insulating layer 07, and stripping the photoresist 14 in the first through hole 11 and the second through hole 12 by an ashing process, as shown in FIG. 5;

S606, ion doping the active layer 02 in the first through hole 11 and the second through hole 12 by a method like ion implantation, and depositing a metal in the first through hole and second through hole by a method like magnetron sputtering, to form a pattern of the source 08 and the drain 09, as shown in FIG. 4i.

Figure 7:
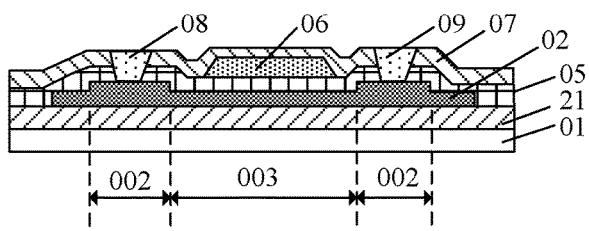
FIG. 7 is a structural view illustrating a thin film transistor according to an embodiment of the present invention.

Accordingly, embodiments of the present invention provide a thin film transistor. As shown in FIG. 7, the thin film transistor comprises the active layer 02 on the substrate 01, the source 08 and drain 09 on the active layer 02 and electrically connected with the active layer, and the gate 06 on the active layer. In the active layer 02, regions 002 to which the source 09 and the drain 09 correspond are thicker than the semiconductor region 003 between the regions 002 to which the source 08 and the drain 09 correspond. As used herein, the expression "regions to which the source and the drain correspond" refers to regions of the active layer where the source and the drain are located as well as nearby regions around them.

For example, the thin film transistor further comprises the buffer layer 21 between the substrate and the active layer, the gate insulating layer 05 between the active layer 02 and the gate 06, and the interlayer insulating layer 07 on the gate 06.

Figure 8:
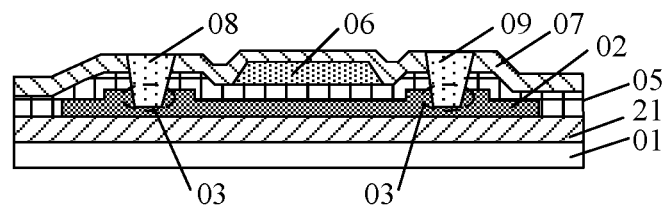
FIG. 8 is a structural view illustrating another thin film transistor according to an embodiment of the present invention.

During implementation, in an embodiment of the above thin film transistor, the following measures are used to further increase the contact area between the source and drain and the active layer, increase the area of the ohmic contact region, and decrease the ohmic contact resistance. As shown in FIG. 8, grooves 03 are formed at portions of the source-and-drain-to-be-formed regions in the active layer 02 with which the source 08 and the drain 09 are electrically connected.

On basis of the same inventive concept, embodiments of the present invention provide an array substrate, comprising the thin film transistor in the above embodiments. Since the array substrate solves the problem under the same principle as the thin film transistor, reference can be made to the above thin film transistor for embodiments of the array substrate, which are not repeated here for simplicity.

On basis of the same inventive concept, embodiments of the present invention further provide a display device, which can comprise any product or component with a display function, such as a mobile phone, a tablet computer, a TV set, a monitor, a notebook computer, a digital frame, a navigator. Since the display device solves the problem under the same principle as the thin film transistor, reference can be made to the above thin film transistor for embodiments of the array substrate, which are not repeated here for simplicity.

In summary, embodiments of the present invention provide a thin film transistor, a method for fabricating the same, an array substrate, and a display device. In the method, the active layer is firstly formed on the substrate, source-and-drain-to-be-formed regions of the active layer are thicker than the semiconductor region between the source-and-drain-to-be-formed regions. Then, by a patterning process, the gate is formed on the active layer, and the pattern of source and drain is formed in the source-and-drain-to-be-formed regions of the active layer. The source-and-drain-to-be-formed regions of the active layer are thicker than the semiconductor region between the source-and-drain-to-be-formed regions. Therefore, when through holes are in the active layer to form the pattern of source and drain by an etching process, poly silicon in the active layer is prevented from being etched through. This improves contact between the source and drain and the active layer, thus improving stability of the thin film transistor. Furthermore, in the method, grooves are formed at portions of the source-and-drain-to-be-formed regions of the active layer with which the source and the drain are electrically connected. This facilitates increasing the contact area between the source and drain and the active layer of the thin film transistor, increasing an ohmic contact region which will be formed when the source and the drain contact the active layer, and decreasing a contact resistance of the ohmic contact region. The grooves have a sectional width smaller than the source-and-drain-to-be-formed regions, and this facilitates increasing the contact area between the source and drain and the active layer of the thin film transistor.

Apparently, the person with ordinary skill in the art can make various modifications and variations to the present invention without departing from the spirit and the scope of the present invention. In this way, provided that these modifications and variations of the present invention belong to the scopes of the claims of the present invention and the equivalent technologies thereof, the present invention also intends to encompass these modifications and variations.

What is claimed is:

1. A method for fabricating a thin film transistor, comprising:

step S101, forming an active layer on a substrate, wherein source-and-drain-to-be-formed regions of the active layer are thicker than a semiconductor region between the source-and-drain-to-be-formed regions; and step S102, by a patterning process, forming a gate on the active layer, forming grooves at portions of the source-and-drain-to-be-formed regions of the active layer with which a source and a drain are electrically connected, etching away a portion of the source-and-drain-to-be-formed regions by which the source-and-drain-to-be-formed regions are thicker than the semiconductor region, and forming a pattern of source and drain in the grooves, wherein step S101 comprises:

step S1011, forming a poly silicon layer on the substrate; and step S1012, by a patterning process, forming a pattern of active layer from the poly silicon layer, wherein source-and-drain-to-be-formed regions of the pattern of active layer are thicker than the semiconductor region between the source-and-drain-to-be-formed regions, and wherein step S1012 comprises:

step S1012A, applying photoresist on the poly silicon layer, and exposing and developing the photoresist with a mask to form a photoresist-completely-reserved region, a photoresist-partially-reserved region, and a photoresist-completely-removed region, wherein the photoresist-completely-reserved region corresponds to the source-and-drain-to-be-formed regions, the photoresist-partially-reserved region corresponds to the semiconductor region between the source-and-drain-to-be-formed regions;

step S1012B, etching the poly silicon layer to which the photoresist-completely-removed region corresponds for the first time, to completely strip the poly silicon layer to which the photoresist-completely-removed region corresponds;

step S1012C, by an ashing process, stripping the photoresist in the photoresist-partially-reserved region, and thinning the photoresist in the photoresist-completely-reserved region; and step S1012D, etching the poly silicon layer to which the photoresist-partially-reserved region corresponds for the second time, to form the pattern of active layer.

2. The method of claim 1, wherein the grooves have a sectional width smaller than the source-and-drain-to-be-formed regions.

3. The method of claim 1, wherein after step S1012D, the method further comprises:
step S1012E, stripping the photoresist to which the photoresist-completely-reserved region corresponds.

4. The method of claim 1, wherein step S1012D comprises:
dry etching the poly silicon layer to which the photoresist-partially-reserved region corresponds, so that the poly silicon layer to which the photoresist-partially-reserved region corresponds is thinner than the poly silicon layer to which the photoresist-completely-reserved region corresponds, and the poly silicon layer to which the photoresist-partially-reserved region corresponds has a thickness larger than zero.

5. The method of claim 1, wherein the mask is a half tone mask, a gray tone mask, or a mask with slits.

6. The method of claim 1, wherein step S102 comprises:
step S1021A, by a patterning process, forming in sequence a gate insulating layer, the gate, and an interlayer insulating layer on the active layer;

step S1021B, forming a first through hole and a second through hole in regions of the source-and-drain-to-be-formed regions of the active layer to which the interlayer insulating layer and the gate insulating layer correspond, wherein the first through hole enables the source to be formed to be electrically connected with the active layer, and the second through hole enables the drain to be formed to be electrically connected with the active layer; and step S1021C, forming a pattern of source in the first through hole, and forming a pattern of drain in the second through hole at the same time.

7. The method of claim 6, wherein step S1021C comprises:
forming a patterned photoresist layer on the interlayer insulating layer, wherein the patterned photoresist layer does not cover regions where the first through hole and the second through hole are located; and by a patterning process, forming the pattern of source in the first through hole, and forming the pattern of drain in the second through hole at the same time.

8. The method of claim 6, wherein step S1021C further comprises:
after forming the patterned photoresist layer, and prior to forming the pattern of source and the pattern of drain, doping the active layer through the first through hole and the second through hole by ion implantation.

* * * * *